United States Patent [19]
Dean

[11] 3,951,708
[45] Apr. 20, 1976

[54] METHOD OF MANUFACTURING A SEMICONDUCTOR DEVICE

[75] Inventor: Raymond Harkless Dean, Shawnee Mission, Kans.

[73] Assignee: RCA Corporation, New York, N.Y.

[22] Filed: Oct. 15, 1974

[21] Appl. No.: 514,938

[52] U.S. Cl............................... 156/3; 29/571; 29/578; 29/579; 156/11; 156/13; 156/17; 156/18; 357/23; 427/89; 427/91
[51] Int. Cl.².................. H01L 21/28; H01L 21/302
[58] Field of Search.................. 156/3, 7, 17, 18, 8, 156/11; 29/511, 578, 580, 591; 427/89, 91; 357/23, 27

[56] References Cited
UNITED STATES PATENTS

| | | | |
|---|---|---|---|
| 3,761,785 | 9/1973 | Pruniaux............................ | 29/579 |
| 3,813,585 | 5/1974 | Tarui et al........................... | 156/17 |
| 3,823,352 | 7/1974 | Pruniaux et al..................... | 29/571 |
| 3,851,379 | 12/1974 | Gutneckt et al.................... | 29/579 |
| 3,898,353 | 8/1975 | Napoli et al. ....................... | 427/89 |

Primary Examiner—William A. Powell
Assistant Examiner—Jerome W. Massie
Attorney, Agent, or Firm—Harold Christoffersen; Robert P. Williams; William L. Muckelroy

[57] ABSTRACT

A semiconductor device having a pair of laterally spaced multiple-layer metal films, each located in a different vertically-spaced parallel plane on a body of a single crystalline semiconductor material and a channel between the spaced edges of the pair of metal films. The edges of the pair extend in cantilever fashion over the channel. First and second laterally spaced Schottky-barrier metal films are located in the channel and form gate contacts. The first metal film is located completely beneath the uppermost multiple-layer film. The second metal film is located substantially below an aperture formed between the pair of multiple-layer metal films. A contact pad for the first film is on the outside of the channel near one end thereof, and a contact pad for the second film is located near the other end. The Schottky-barrier films are typically less than 0.8 micrometers wide. In making the semiconductor device, the two Schottky-barrier films are electrically isolated by depositing the first film from an angle onto a portion of the bottom of the channel beneath the uppermost cantilevered film and removing a part of this first film at the end away from its contact and by depositing the second film from a position above the aperture formed by the cantilevered films.

15 Claims, 20 Drawing Figures

METHOD OF MANUFACTURING A SEMICONDUCTOR DEVICE

This invention herein disclosed was made in the course of or under a contract or subcontract thereunder with the Department of the Air Force.

The present invention relates to a semiconductor device and a method of making the same. More particularly, the present invention relates to a semiconductor device having on an epitaxial body of a semiconductor material at least two multiple-layer contacts, one each of which is located on either side of a channel, and extending over the channel in cantilever fashion, and at least two more Schottky-barrier metal films located side-by-side in the channel with one of the Schottky-barrier metal films being located completely beneath one of the cantileversed multiple-layer films.

Desirable signal processing features in semi-conductor device have been obtained in the past by sacrificing the dynamic range of the device. This is especially true in the case of χ-band traveling wave transistors. The surface current density in the traveling wave portion of such devices has to be kept below a certain critical value to prevent the occurrence of Gunn-type oscillations. When the traveling wave region is several wavelengths long, this critical surface current density is about ten times lower than the surface current density required for optimum performance of conventional gallium arsenide field-effect transistors. Thus, the constraint on surface current density in a long traveling wave transistor forces both input and output portions of the device to be suboptimal. The suboptimal input results in a relatively high noise figure, and the suboptimal output results in a relatively low saturation power.

To alleviate the problem of relatively low power saturation, the traveling wave region may be shortened. The short length of the traveling region allows a high stability surface current density in the traveling wave region of the device. Thus, the traveling wave region stability constraint can be satisfied without sacrificing the performance of the input and output portions of the device.

The surface current density constraint is circumvented simply by shrinking the length of the traveling wave region and transforming the traveling wave transistor into a dual gate field-effect transistor made of, for example, gallium arsenide.

If the width of the second gate on a dual-gate gallium arsenide field-effect transistor is less than about twice the thickness of the middle semiconducting region, the region having a moderate doping density, the field can be maintained above the transferred electron threshold field continuously from the edge of the first gate nearest the drain to the drain itself. By adjusting the bias between the first and second gates, it becomes possible to obtain a drift region between the first and second gates in which the field is in the negative-differential-mobility range. Accordingly, the surface current density can be set to optimize the performance of a device as a field-effect transistor, both for low noise and for power.

Since the negative-differential-mobility in the region between the gates causes a density perturbation under the first gate to increase in the direction of the second gate, a significant amount of additional gain is realizable. Additional isolation is also achieved because the second gate acts as a screen grid. The screen grid action of the second gate reduces feedback and lowers output conductance.

The second gate also retains the very high field region between the second gate and the drain and prevents it from reaching back under the first gate. This side-by-side geometry of the gates reduces the noise figure. In addition, the second gate prevents the voltage swing on the first gate from being added to the voltage swing on the drain. This allows for the obtainment of a higher drain voltage before breakdown.

The use of the second gate extends the distance between the controlling first gate and the drain and thereby makes the input-to-output phase shift in the dual gate field-effect transistor greater than the input-to-output phase shift in a conventional single gate field-effect transistor.

Significant among the prior published art related to the invention are the following:

1. U.S. Pat. No. 3,714,523, issued to Robert Thomas Bate on Jan. 30, 1973;
2. U.S. Pat. No. 3,764,865, issued to Louis S. Napoli on Oct. 9, 1973;
3. U.S. Pat. No. 3,678,573, issued to Michael D. Driver on July 25, 1972; and
4. U.S. Pat. No. 3,675,313, issued to Michael C. Driver on July 11, 1972.

The patent to Bate, although it discloses two gates for a field-effect transistor device, is distinguishable from the present invention because the gates are insulated and extend side-by-side in the electron drift direction.

The patent to Napoli does disclose source and drain contacts extending in cantilever fashion over a channel with a gate on the bottom of the channel. However, the Napoli device is not designed for high frequency nor does it aver to or suggest that a gate may be formed completely beneath either the source or drain contact.

The first-mentioned patent to Driver does relate to a high frequency field-effect transistor. However, the source and drain contacts in this device are not located on different levels, and neither has a vertical, overhanging portion to ensure complete isolation of one gate from another after processing.

The second-mentioned Driver patent does disclose the utilization of angular deposition from a source in order to obtain shadowing by overhanging contacts and to achieve deposition beneath a contact. However, this patent does not show the deposition of a complete gate entirely beneath an overhanging contact. In the drawings.

Figure 4A:
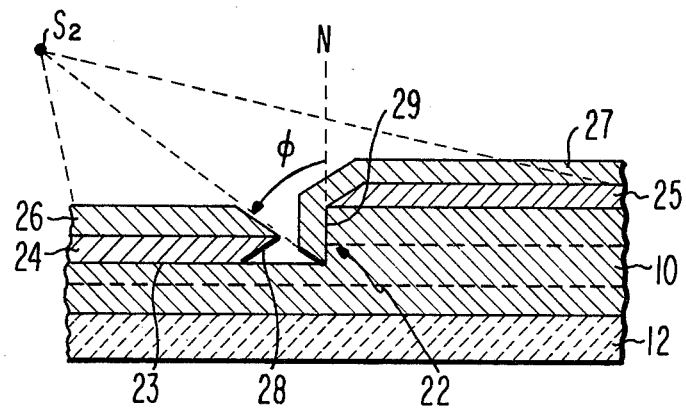
Figure 4B:
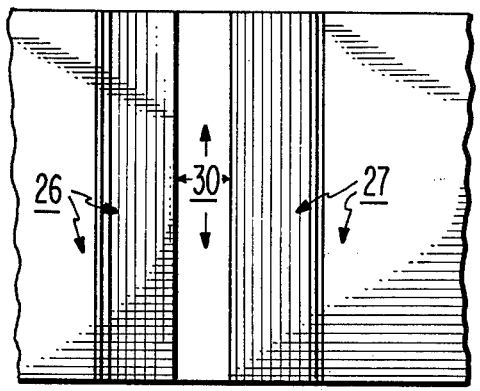
Figure 4C:
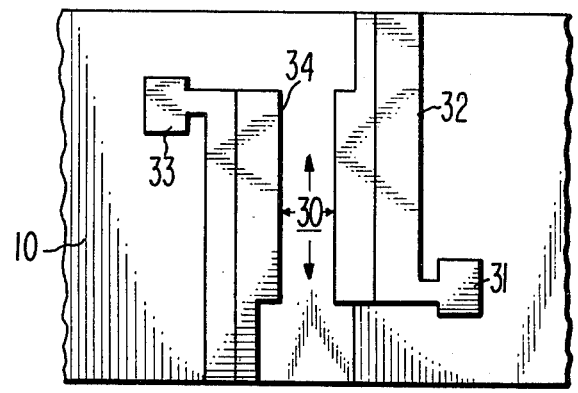
Figure 4D:
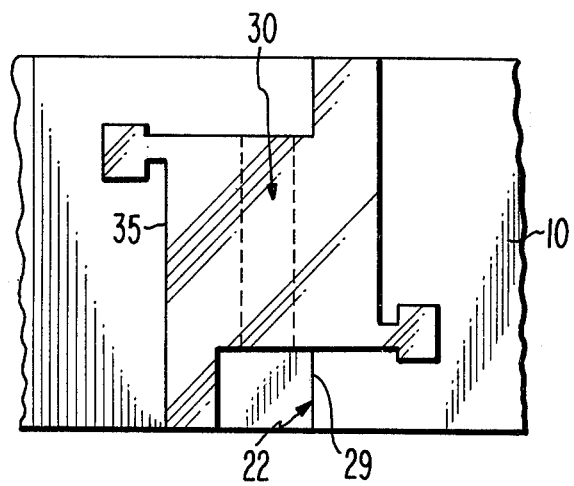

FIG. 4a is a sectional view showing the step of depositing the second layer of the source and drain contacts of the device. FIG. 4b is a top view of the deposition made in FIG. 4a; FIG. 4c is a top view of defined source and drain contacts with defined bonding pads; and FIG. 4d is a top view of the photoresist pattern used to define the source and drain contacts and pads shown in FIG. 4c.

Figure 5A:
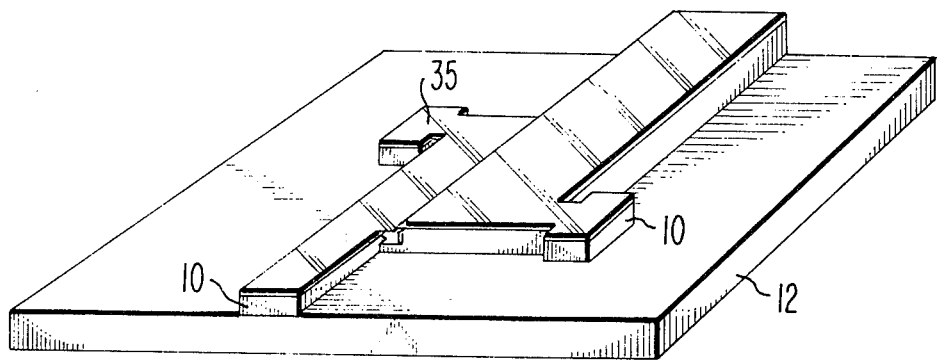
Figure 5B:
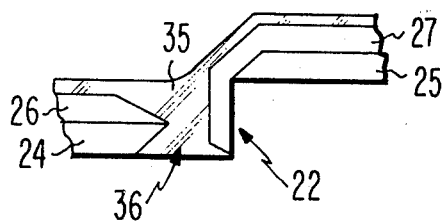
Figure 5C:
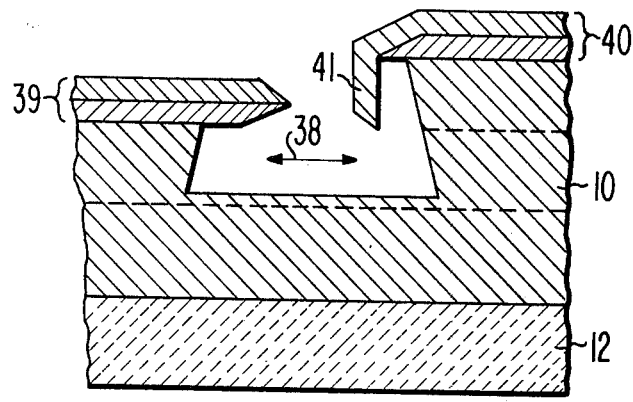
Figure 5D:
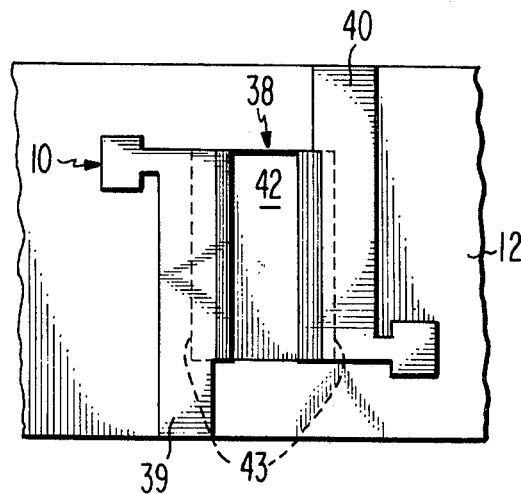

FIG. 5a is an elevated view of the pattern of the semiconductor material of the device with the source and drain contacts thereon after selective etching. FIG. 5b is a magnified view of the region between the source and drain contact with shielding material present; FIG. 5c is an enlarged sectional view showing the formation of the channel beneath the source and drain contacts; and FIG. 5d is a top view of the device of the invention with the channel formed between the source and the draiin contacts.

Figure 6:
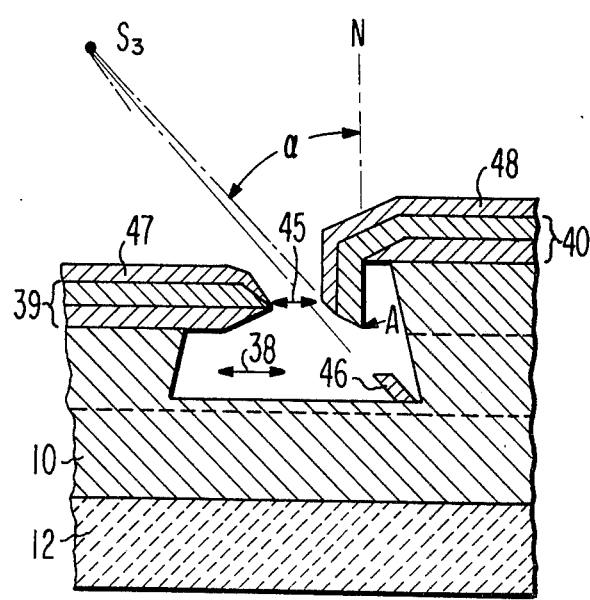

FIG. 6 is a sectional view illustrating the step of depositing the first gate.

Figure 7:
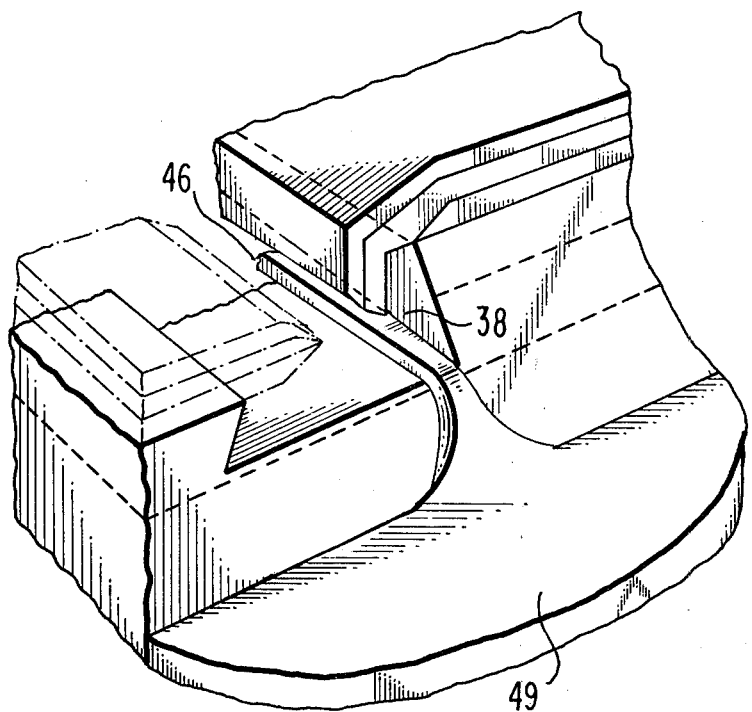

FIG. 7 is an elevated and magnified perspective view of the region near one end of the channel of the device after deposition of the first gate metal.

Figure 8A:
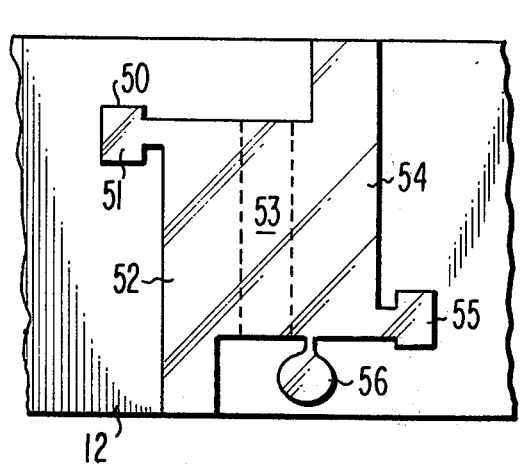
Figure 8B:
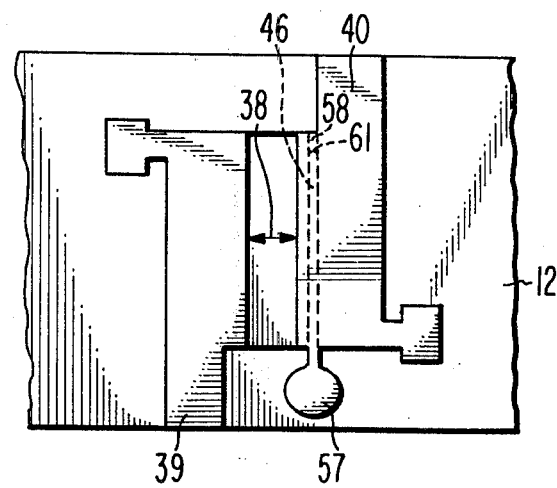

FIG. 8a is a top view showing the photoresist mask used in the step for forming the first gate contact pad; and FIG. 8b is a top view of the device of the invention showing the formation of the first gate contact pad and its extension beneath the source contact.

Figure 9A:
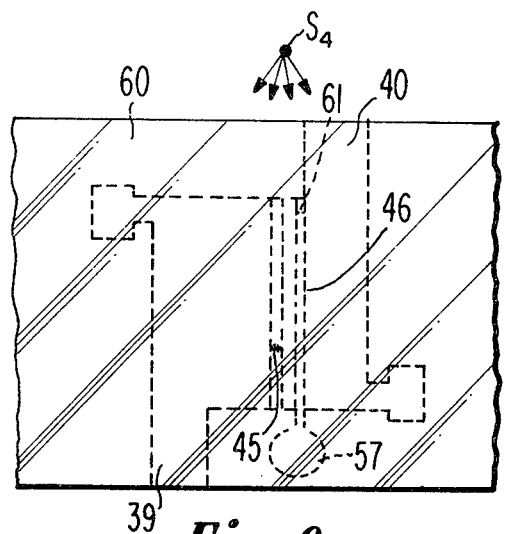
Figure 9B:
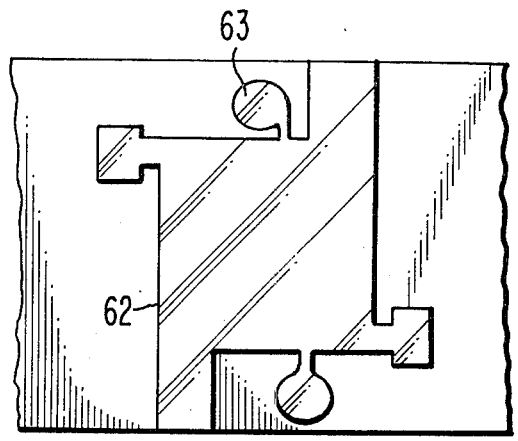
Figure 9C:
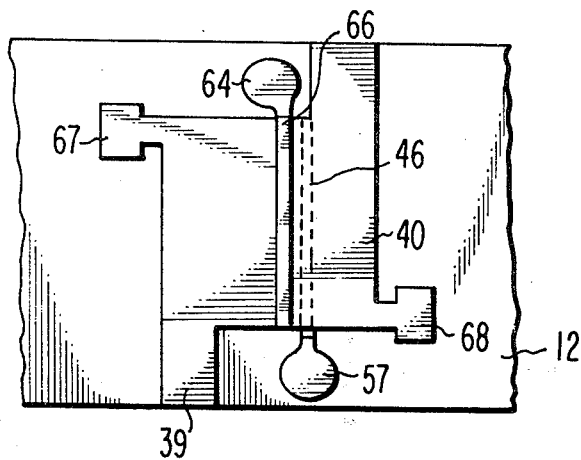

FIG. 9a shows the step of depositing the second gate metal layer; FIG. 9b shows the photoresist pattern used to define the second gate contact pad and to protect the first gate contact pad and the source and drain contacts and bonding pads; and FIG. 9c is a top view showing the completed device of the invention with dual gates.

Figure 10:
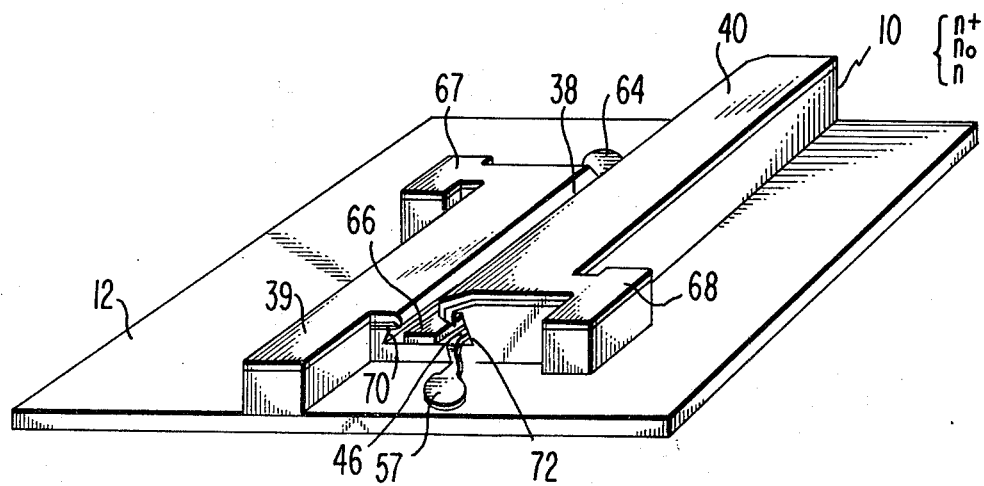

FIG. 10 is an elevated perspective view of the device of the invention showing both gates and both gate contact pads.

Figure 1:
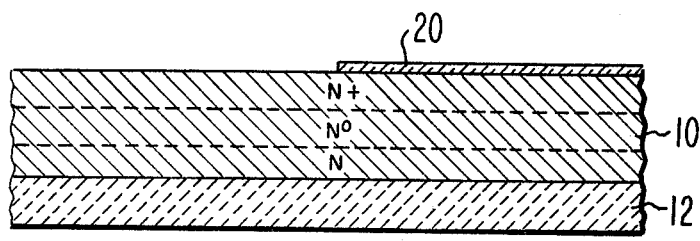
FIG. 1 and FIG. 2 are sectional views showing steps for making two levels in the semiconductor material of the invention.

The device of the invention is formed in epitaxial material made of three layered regions. FIG. 1 shows a semiconductor epitaxial body 10 of the invention on a substrate 12 and having at least three regions. In the preferred embodiment of the invention, the semiconductor material of the epitaxial body 10 is gallium arsenide. The three regions $n$, $n^o$, and $n^+$ are, in the preferred embodiment, a lightly doped region, a moderately dope region, and a heavily doped region, respectively. The moderately doped region $n$ is used for the field-effect transistor channel, and the heavily dope region $n^+$ is used for low resistance ohmic contacts for the drain and the source, to be described below. The substrate 12 may be any material suitable for the epitaxial formation of gallium aresnide thereon and having a high resistivity in comparison to that of the regions $n$, $n^o$, and $n^+$ of the epitaxial body 10. Also shown in FIG. 1 is a masking material 20 on the surface of the epitaxial body 10 of gallium arsenide. This masking material 20 is utilized to etch at step, typically 1 $\mu$m, in the body 10 down to the $n^o$ region using an orientation dependent etchant. It is very important that the surface of this step be approximately orthogonal to the surface formed in the middle region $n^o$.

Figure 2:
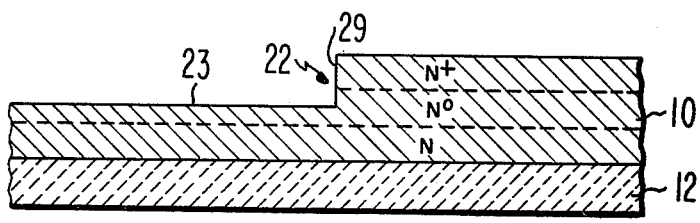

FIG. 2 shows the step 22 etched into the epitaxial body 10 of gallium arsenide to form vertical surface 29. Any suitable etchant well known in the art for this purpose may be utilized. One particularly suitable for etching gallium arsenide is a mixture of sulfuric acid and hydrogen peroxide.

Figure 3A:
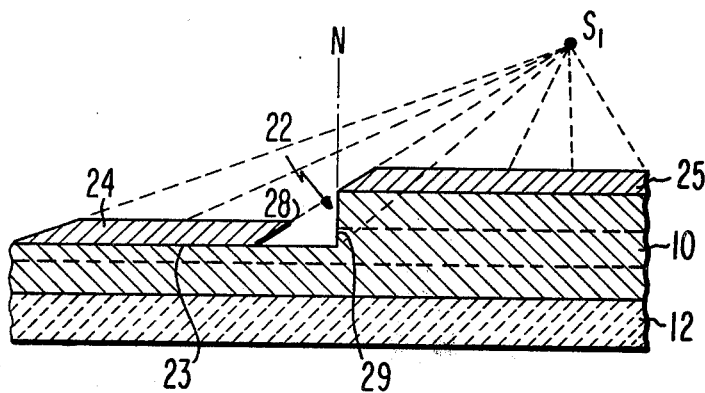
FIG. 3a is a sectional view showing deposition of the first layer of the source and drain contacts; and, FIG. 3b is a top view of this deposition onto the semiconductor material of the device.
Figure 3B:
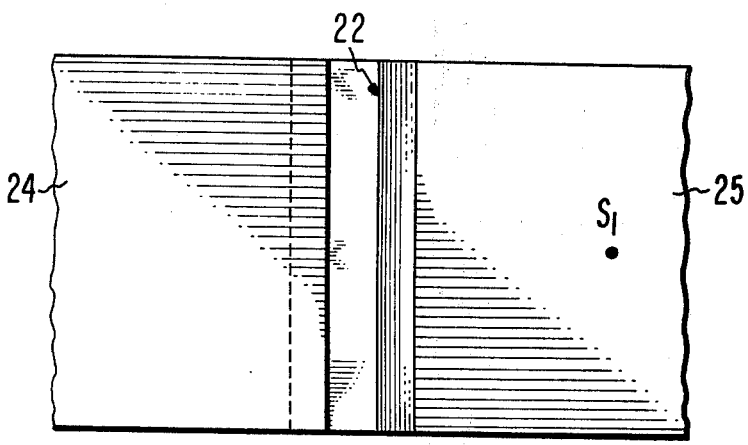

In FIG. 3a, the step 22 is shown in its relationship to an evaporation source S, for use as a shadow mask for the deposition of metal layers 24 and 25. From the source $S_1$, 0.3 $\mu$m thick layers 24 and 25 of sequentially deposited titanium, palladium, and gold are evaporated onto the epitaxial body 10. The source $S_1$ is located above the uppermost portion of the epitaxial body 10 at a preselected orthogonal distance away from a normal N, which is extended from the step 22. The location of source $S_1$ is further established at a position determined by a clockwise rotation of an angle $\theta$ measured about the line of intersection of the vertical surface 29 and the horizontal surface 23 of the step 22. Typically $\theta$ is 65°. This angle $\theta$, at which the source $S_1$ is located, determines, in combination with the elevation of the source $S_1$ above the uppermost portion of the epitaxial body 10, the spacing between the edge 28 of the deposited layer 24 and the vertical surface 29 of the step 22. This spacing is important because it determines the size of the channel, which is later etched and used for depositing the gates, as will be described below. FIG. 3b is a top view of the deposited metal layers 24 and 25 and the step 22.

In FIG. 4a, there is shown an additional step in the process for making the semiconductor device. A second source $S_2$ is located above the lowermost surface of the epitaxial body 10. This source $S_2$ is located to the left of the normal N at an angle of rotation $\theta$ counterclockwise from the normal about the line defined by the intersection of the vertical and horizontal surfaces 29 and 23 of the step 22. Typically, $\phi$ is 75°. This source $S_2$ creates additional layers of sequentially deposited titanium, palladium, and gold to form composite 0.3 $\mu$m thick layers 26 and 27. The layer 26 is located on top of the previously deposited layer 24, and the layer 27 is located on top of the previously deposited layer 25. The foremost edge 28 of the layer 24 acts as a shadow mask and shields a portion of the surface of the epitaxial body 10 nearest the step 22 from deposition of metal from the source $S_2$. However, metal is deposited on the vertical surface 29 of the step 22. Hence, the layer 27 is comprised of a vertical portion and a horizontal portion. The horizontal portion of the layer 27 extends over the entire surface of the layer 25. The vertical portion of the layer 27 covers the vertical wall 29 of the step 22.

FIG. 4b is a plan view of the formation shown in FIG. 4a. FIG. 4b also shows that there is an area 30 between the layer 26 and the layer 27 which is not coated with a deposition from either the source $S_1$ or the source $S_2$. After defining contacts for the electron source and for the drain, the area 30 will be etched to form a channel for deposition of the gates.

The combination of the layers 24 and 26 forms a drain contact and a drain contact pad when defined. The combination of the layers 25 and 27 forms a source contact and a source contact pad when defined. In order to define the source and the drain contacts and their respective pads, photoresist masking techniques commonly known in the art are used. Any suitable photoresist may be used to form the mask pattern for the source contact, the drain contact, and their respective pads.

FIG. 4c is a top view of the pattern of the source and the drain contacts and their respective contact pads. A source contact pad 31 is shown connected to a source contact 32. A drain contact pad 33 is shown connected to a drain contact 34. The surrounding areas are comprised of exposed portions of the epitaxial body 10 of gallium arsenide.

FIG. 4d is a top view of the photoresist mask used to form the source contact 32, the drain contact 34, the drain contact pad 33, and the source contact pad 31 of FIG. 4c. The photoresist mask 35 shown in FIG. 4d should be of a material suitable for resisting ion beam milling. The photoresist pad 35 is patterned to leave photoresist over the source and drain contacts and pads as well as over the area 30. Not all of the vertical wall 29 of the step 22 is protected by the photoresist 35. Although the pattern shown in FIG. 4c may be defined in the metal by a suitable metal etchant, an equally suitable technique is to form the pattern of FIG. 4c by ion beam milling.

Using ion beam milling, a structure for the device such as is shown in FIG. 5a is produced. The epitaxial body 10 of gallium arsenide is removed down to the substrate 12. The ion milling resistant photoresist coating 35 is shown on top of the preselected area for the source contact and the drain contact and their respective contact bodning pads.

FIG. 5b is a magnified view of the channel region of the device of FIG. 5a. The cavity 36 between the drain contact, comprised of layers 24 and 26, and the source contact, comprised of layers 25 and 27, is filled with the photoresist 35.

Upon removal of the photoresist 35, the next step in the process of making the device is etching of the cavity 36 to form a channel. The duration of this etching step is determined by an electrical measurement of the current between the source and drain contacts. The proper saturation current for a 16 milli-inch (0.4 mm) wide channel is approximately 130 milliamperes.

In FIG. 5c, a channel 38 is shown etched between the drain contact 39 and the source contact 40. The edge of the drain contact extends over the channel 38 in cantilever fashion. The source contact 40 is made of two portions. One portion is horizontal and rests on the uppermost portion of the semiconductor material 10. The second portion 41 is vertical and extends downward into the channel 38 and is suspended from the horizontal portion of the source contact 40.

FIG. 5d shows the epitaxial body 10 of the invention, with the channel 38 formed by etching between the source contact 40 and the drain contact 39. The bottom 42 of the channel 38 extends underneath the source and drain contacts, as indicated by the dotted lines 43.

FIG. 6 shows the next step in the process of making the device. A third source $S_3$ is used to deposit a 1 $\mu$m wide strip of Schottky-barrier metal in the channel, for the first gate 46. The source $S_3$ is located above the lowermost portion of the epitaxial body 10 and away from a slot 45 formed between the edges of the source and the drain contact 40 and 39. The position of $S_3$ may be further characterized by a rotation $\alpha$ counterclockwise about the line of intersection A of the step. Typically, $\alpha$ is 45°.

In depositing the conductive material for the first gate 46, additional layers 47 and 48 are formed. Layer 47 is formed on top of the drain contact 39. Layer 48 is formed on top of the source contact 40. The source $S_3$ is located in a position such that the deposition of the conductive material for the gate 46 occurs entirely beneath the source contact 40. The gate 46 typically has a cross-sectional area shaped in the fashion of a parallelogram. The source contact 40 with the layer 48 thereon extends in cantilever fashion over the channel 38, and a vertical portion thereof extends into the channel 38.

FIG. 7 is an elevated view of one end of the channel 38 of the deposition illustrated in FIG. 6. In addition to the gate 46 formed in the channel 38, an additional deposition of material 49 occurs outside the channel on each end. Deposited material 49 is used to form a bonding pad outside of the channel for the gate 46. The bonding pad is defined by etching the conductive material deposited from the source $S_3$ with a suitable chemical etchant.

In etching the material 49 deposited from the source $S_3$ to form a bonding pad for the first gate, a photoresist pattern 50 such as that which is shown in FIG. 8a is used. Photoresist pattern 50 is a continuous region of photoresist made up of the areas for a drain contact bonding pad area 51, a drain contact area 52, a channel area 53, a source contact area 54, a source contact bonding pad area 55, and a bonding pad area 56 for the first gate 46. After etching the deposition from the source $S_3$ according to the pattern in FIG. 8a, the structure illustrated in FIG. 8b is formed. A first gate bonding pad 57 is formed and connected to the first gate 46 which extends under the source contact 40. The etchant used to form the bonding pad 57 of the gate 46 is permitted to leach a portion 58 of the gate 46 from the end of the channel remote from the gate bonding pad 57 and beneath the source contact 40 to define an end 61 of the gate 46. This is accomplished by permitting the structure with the photoresist pattern on top to remain in the etchant for an extended period of time (approximately 50% to 100% more) beyond that which is necessary for the proper formation of the bonding pad 57.

The next step is the deposition of the conductive layer necessary for the second gate.

The second gate is formed from a deposition of a Schottky-barrier metal 60 from a source $S_4$, located at a position above the channel, through the aperture 45 above the channel (see FIG. 9a). Usually, $S_4$ is positioned for a normal angle of incidence into the channel. The metal 60 from the source $S_4$ is deposited over the entire remaining surface of the substrate 12 as well as over the drain contact 39 and the source contact 40. The portion of metal 60 in the channel is about 1 $\mu$m wide in the electron drift direction. The bonding pad 57, for the first gate, is shown in dotted lines and is also covered by the deposition 60 from the source $S_4$. Although the deposition 60 from the source $S_4$ is deposited over the entire area of the device, including the source and drain contacts as well as the substrate 10, the deposition does not come into contact with the end 61 of the gate 46, this does not happen because the portion 58 (see FIG. 8b) of the gate 46 beyond the end 61 thereof has been removed, and any deposition from the source $S_4$ at the end of the channel opposite the bonding pad 57 is isolated by sufficient spacing from the end 61.

The structure shown in FIG. 9a with the metal 60 thereon is coated with a photoresist pattern 62 (see FIG. 9b), which is brought into registration with the source and drain regions as well as the bonding pads therefor and the bonding pad 57 for the first gate 46.

To insure that the bonding pad for the second gate is properly connected to the second gate and that the far end of the gate metallization for the second gate is not connected to the bonding pad for the fist gate, the photoresist pattern 62 for the bonding pad of the second gate is exposed 35% to 50% longer than normally required. This assures that the far end of the metallization for the second gate is exposed to the etchant. This over-exposure of the photoresist pattern for the bonding pad of the second gate also insures that the metal under the photoresist 62 and under the end of the overhang of drain at the end not connected to the bonding pad is properly etched. Overetching of the end of the second gate away from its bonding pad assures electrical separation of the second gate from the bonding pad of the first gate.

The pattern 62 has attached to it an area 63 defining the bonding pad for the second gate contact deposited through the aperture 45 (shown in FIG. 9a) to form the second gate. The metal deposited from the source S₄ is one which is suitable for the formation of a Schottky barrier between it and the epitaxial body 10 of gallium arsenide. The structure of FIG. 9a with the pattern 62 as defined in FIG. 9b is etched to produce the structure of FIG. 9c. FIG. 9c shows the completed device of the invention.

Although there is the additional deposition from the source S₄ on the source contact 40 and the drain contact 39 as well as on their respective bonding pads 67 and 68, this deposition does not affect the utility of the composite layers as contacts. The bonding pad 57 for the first gate 46 now also has an additional layer of metal deposited from the source S₄. The second gate 66 is connected over the edge of the channel to its bonding pad 64 which is appositioned to the substrate 12.

FIG. 10 is an elevated perspective view of the device of the invention as previously shown in FIG. 9c. All of the photoresist has been removed from beneath the source and drain contacts. Remaining is the open channel 38 which extends between the source and drain contacts. The open channel 38 has sidewalls 70 and 72. Sidewall 72 is higher than sidewall 70.

What is claimed is:

1. A method for making a plurality of gates in a channel of a semiconductor device located on a substrate having at least first and second spaced contacts which extend in cantilever fashion over the channel to form an aperture comprising the steps of:
    a. depositing a conductive film for a first gate underneath the first spaced contact and outside the channel from a source;
    b. forming a first resistive pattern over a first connected region defined by the areas of the two spaced contacts, the channel, and a first gate contact which extends from an end of the channel onto the substrate;
    c. defining the conductive film for the first gate according to the first pattern;
    d. removing a part of the conductive film for the first gate located within the channel and beneath the first spaced contact at the end of the channel remote from the first gate contact;
    e. removing the first pattern;
    f. depositing a conductive film for a second gate in the channel and outside the channel from a source;
    g. forming a second resistive pattern over a second connected region defined by the areas of the first connected region and an area for a second gate contact located at the end of the channel away from the first gate contact; and
    h. defining the deposited conductive film according to the second resistive pattern, whereby an electrically isolated second gate contact is formed.

2. The method of claim 1 wherein the step of removing a part of the conductive film includes etching the conductive film by soaking the device with the resistive film atop in an etchant for an extended period of time, whereby etching of a part of the conductive film from beneath the resistive film results.

3. The method of claim 2 wherein the step of depositing a conductive film for the first gate further includes depositing the film through the aperture.

4. The method of claim 3 wherein the conductive films are comprised of metal films.

5. The method of claim 4 wherein the steps for forming resistive patterns include depositing photoresist, exposing the photoresist according to a mask, and developing the photoresist.

6. The method of claim 5 wherein the steps of defining the metal films include etching the metal films.

7. The method of claim 6 wherein the metal films are Schottky-barrier contact metals.

8. The method of claim 7 wherein the steps of depositing metal films include depositing the metal films through a slot formed by first and second spaced contacts located at different levels on the device.

9. The method of claim 8 further comprising the step of removing the second pattern.

10. The method of claim 9 wherein the step of removing a part of the conductive film of the first gate located within the channel comprises removing only a portion of the film from underneath the first spaced contact at the end of the channel away from the first gate contact.

11. A method for making a dual-gate Schottky barrier field-effect transistor comprising the steps of:
    a. etching a step with a substantially vertical wall between a high surface and a low surface in a layer of a semiconductor material appositioned to a substrate;
    b. depositing a first layer of at least one metal from a first source located at a position characterized by a displacement above the high surface and a rotation clockwise by an angle $\Theta$ from a normal extending from the step;
    c. depositing a second layer of at least one metal from a second source located at a position characterized by a displacement above the low side and a rotation counterclockwise by an angle $\phi$ from the normal, $\phi$ being selected so that the second layer is deposited only on the first layer and on the wall of the step;
    d. forming a channel with a floor and sidewalls tilted in pyramid fashion beneath an aperture between metal layers formed on each side of the step in cantilever fashion and whereby the metal layer on the low side forms the drain contact and the metal layer on the high side forms the source contact;
    e. forming a first resistant pattern over a first connected region defined by the areas of the source and drain contacts and the channel;
    f. removing all exposed semiconductor material and all exposed metal layers down to the substrate;
    g. removing the first pattern;
    h. depositing Schottky-barrier metal film for a first gate on the floor of the channel beneath the source contact and outside the channel;
    i. forming a second resistive pattern over a second connected region defined by the first connected region and an area for a first gate contact which extends from an end of the channel onto the substrate;
    j. defining the deposited metal films according to the second pattern;
    k. removing first gate metal film located within the channel and beneath the first spaced contact at the end of the channel away from the first gate;
    l. removing the second resistive pattern;
    m. depositing a Schottky-barrier metal film for a second gate on the floor of the channel beneath the aperture and outside the channel;
    n. forming a third resistive pattern over a third connected region defined by the second connected region and an area for a second gate contact for the second gate, the second gate contact being located at the end of the channel away from the first gate contact;

o. defining the Schottky metal film deposited for the second gate according to the third resistive pattern whereby the second gate contact is electrically isolated from the first gate metal film.

12. The method of claim 21 wherein the step of depositing the film for the first gate includes depositing the first gate metal film from a source located at a position above the low surface.

13. The method of claim 22 wherein the step of depositing the film for the second gate includes depositing the second gate metal film from a source located at a position above the aperture.

14. The method of claim 23 wherein the step of removing all exposed semiconductor material and all exposed metal layers down to the substrate includes removing by ionic bombardment.

15. The method of claim 24 wherein the step of removing first gate metal film within the channel and underneath the first spaced contact at the end of the channel away from the first gate includes removing a portion of the film from underneath the first spaced contact at the end of the channel away from the first gate contacts whereby the gate contact metal is removed by etching this metal from underneath the resistive pattern.

* * * * *

UNITED STATES PATENT OFFICE
CERTIFICATE OF CORRECTION

PATENT NO. : 3,951,708
DATED : April 20, 1976
INVENTOR(S) : Raymond Harkless Dean It is certified that error appears in the above-identified patent and that said Letters Patent are hereby corrected as shown below:

Col. 1, line 18, "cantileversed" should be --cantilevered--.
Col. 3, line 6, "draiin" should be --drain--;
      line 37, "dope" should be --doped--;
      line 41, "aresnide" should be --arsenide--;
      line 60, "0.3" should be --3--.
Col. 4, line 16, "θ" should be --∅--;
      line 22, "0.3" should be --3--.
Col. 5, line 10, "bodning" should be --bonding--;
      line 44, "contact" should be --contacts--;
      line 60, "view of one end" should be --view at one end--
Col. 6, line 56, "fist" should be --first--.
Col. 9, line 9, "claim 21" should be --claim 11--;
      line 13, "claim 22" should be --claim 12--.
Col. 10, line 3, "claim 23" should be --claim 13--;
      line 7, "claim 24" should be --claim 14--.

Signed and Sealed this

Thirty-first Day of August 1976

[SEAL]

Attest:

RUTH C. MASON
*Attesting Officer*

C. MARSHALL DANN
*Commissioner of Patents and Trademarks*